United States Patent
Umeda et al.

(10) Patent No.: US 12,414,453 B2
(45) Date of Patent: Sep. 9, 2025

(54) LIGHT-EMITTING DEVICE

(71) Applicant: SHARP KABUSHIKI KAISHA, Sakai (JP)

(72) Inventors: Tokiyoshi Umeda, Sakai (JP); Yuto Tsukamoto, Sakai (JP); Bai Zhang, Sakai (JP); Shinichi Kawato, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 706 days.

(21) Appl. No.: 17/273,288

(22) PCT Filed: Sep. 11, 2018

(86) PCT No.: PCT/JP2018/033705
§ 371 (c)(1),
(2) Date: Mar. 3, 2021

(87) PCT Pub. No.: WO2020/053975
PCT Pub. Date: Mar. 19, 2020

(65) Prior Publication Data
US 2021/0328198 A1    Oct. 21, 2021

(51) Int. Cl.
*H10K 59/38* (2023.01)
*H10K 50/844* (2023.01)
(Continued)

(52) U.S. Cl.
CPC ........... *H10K 59/38* (2023.02); *H10K 50/844* (2023.02); *H10K 50/86* (2023.02); *H10K 50/865* (2023.02);
(Continued)

(58) Field of Classification Search
CPC .... H10K 50/865; H10K 50/86; H10K 50/844; H10K 59/351; H10K 2102/351
See application file for complete search history.

(56) References Cited

U.S. PATENT DOCUMENTS

| 5,455,624 A | 10/1995 | Ishibe et al. |
| 2010/0320494 A1* | 12/2010 | Kim ....................... G02B 27/28 257/98 |

(Continued)

FOREIGN PATENT DOCUMENTS

| JP | H04364779 A | 12/1992 |
| JP | 2005201934 A | 7/2005 |

(Continued)

*Primary Examiner* — Timor Karimy
(74) *Attorney, Agent, or Firm* — ScienBiziP, P.C.

(57) ABSTRACT

The light-emitting device includes a light-emitting element in which a first electrode, a light-emitting layer, and a second electrode are sequentially layered toward a light-emitting face side. The plurality of light-emitting elements include a first light-emitting element configured to emit light of a first color, a second light-emitting element configured to emit light of a second color different from the first color, and a third light-emitting element configured to emit light of a third color different from the first color and the second color. The light-emitting device includes a light absorption layer on the light-emitting face side of the second electrode, in plane view, in common at positions where the light absorption layer is superimposed on the plurality of light-emitting elements, and the light absorption layer absorbs the light of the first color, the light of the second color, and the light of the third color.

14 Claims, 7 Drawing Sheets

(51) Int. Cl.
  *H10K 50/86* (2023.01)
  *H10K 59/35* (2023.01)
  *H10K 59/80* (2023.01)
  *H10K 102/00* (2023.01)

(52) U.S. Cl.
  CPC ....... *H10K 59/351* (2023.02); *H10K 59/8731* (2023.02); *H10K 59/8792* (2023.02); *H10K 2102/351* (2023.02)

(56) References Cited

U.S. PATENT DOCUMENTS

| | | |
|---|---|---|
| 2014/0110688 A1 | 4/2014 | Nakamura et al. |
| 2015/0090991 A1* | 4/2015 | Ishii ................ H10K 50/856 257/40 |
| 2015/0325814 A1 | 11/2015 | Yang et al. |
| 2016/0043338 A1 | 2/2016 | Seo et al. |
| 2016/0079311 A1 | 3/2016 | Lim et al. |
| 2016/0260930 A1 | 9/2016 | Seo et al. |
| 2016/0329383 A1* | 11/2016 | Li .......................... H10K 50/11 |
| 2017/0179435 A1 | 6/2017 | Seo et al. |
| 2017/0277328 A1* | 9/2017 | Kurasawa ............. G06F 3/0412 |
| 2018/0182990 A1* | 6/2018 | Youn .................... H10K 50/131 |
| 2018/0197921 A1* | 7/2018 | Kim ..................... H10K 50/865 |
| 2019/0205603 A1* | 7/2019 | Lee ..................... H10K 77/111 |

FOREIGN PATENT DOCUMENTS

| | | |
|---|---|---|
| JP | 2014086314 A | 5/2014 |
| JP | 2016039151 A | 3/2016 |
| JP | 2017224398 A | 12/2017 |
| KR | 100696557 B1 | 3/2007 |

\* cited by examiner

LIGHT-EMITTING DEVICE

TECHNICAL FIELD

The present disclosure relates to a light-emitting device including a light-emitting element.

BACKGROUND ART

PTL 1 describes an image display device including an optical film having a function of a circular polarizer for the purpose of prevention of external light reflection.

CITATION LIST

Patent Literature

PTL 1: JP 2017-224398 A

SUMMARY

Technical Problem

A display device provided with a circular polarizer has a problem that a film thickness of a device increases by the film thickness of the circular polarizer.

Solution to Problem

In order to solve the above problem, a light-emitting device according to the present disclosure includes a light-emitting face and a plurality of light-emitting elements in which a first electrode, a light-emitting layer, and a second electrode are sequentially layered toward a light-emitting face side. The plurality of light-emitting elements include a first light-emitting element configured to emit light of a first color, a second light-emitting element configured to emit light of a second color different from the first color, and a third light-emitting element configured to emit light of a third color different from the first color and the second color, and on a light-emitting face side of the second electrode, a light absorption layer is provided in common at positions where the light absorption layer is superimposed on the plurality of light-emitting elements in plane view, and the light absorption layer absorbs the light of the first color, the light of the second color, and the light of the third color.

Advantageous Effects of Disclosure

With the configuration described above, installation of a circular polarizer on the light-emitting device can be omitted, and the film thickness of the light-emitting device can be easily reduced.

DESCRIPTION OF EMBODIMENTS

Figure 1:
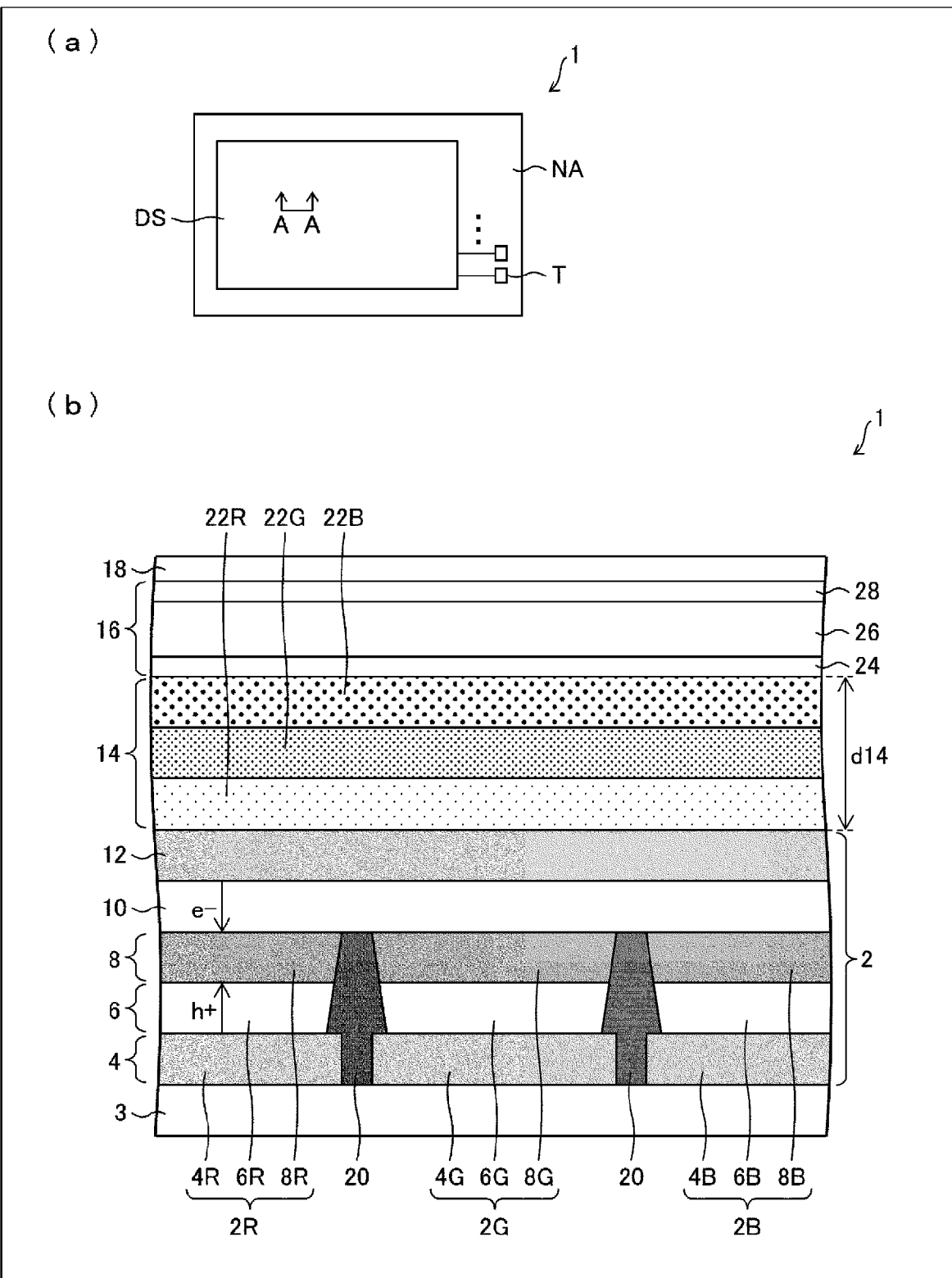
FIG. 1 is a schematic top view and a schematic cross-sectional view of a light-emitting device according to a first embodiment of the present disclosure.

First Embodiment (a) of FIG. 1 is a schematic top view of a light-emitting device 1 according to the present embodiment. (b) of FIG. 1 is a cross-sectional view taken along a line A-A in the direction of the arrows in (a) of FIG. 1.

As illustrated in (a) of FIG. 1, the light-emitting device 1 according to the present embodiment includes a light-emitting face DS from which light emission is extracted and a frame region NA surrounding a periphery of the light-emitting face DS. In the frame region NA, a terminal T may be formed into which a signal for driving a light-emitting element of the light-emitting device 1 described in detail later is input.

At a position superimposed on the light-emitting face DS in plane view, as illustrated in (b) of FIG. 1, the light-emitting device 1 according to the present embodiment, includes a light-emitting element layer 2 and an array substrate 3. The light-emitting device 1 has a structure in which respective layers of the light-emitting element layer 2 are layered on the array substrate 3 in which a thin film transistor (TFT; not illustrated) is formed. In the present specification, a direction from the light-emitting element layer 2 to the array substrate 3 of the light-emitting device 1 is referred to as "downward direction", and a direction from the light-emitting element layer 2 to the light-emitting face DS of the light-emitting device 1 is referred to as "upward direction".

The light-emitting element layer 2 includes, on a first electrode 4, a first charge transport layer 6, a light-emitting layer 8, a second charge transport layer 10, and a second electrode 12, sequentially layered from the lower layer. The first, electrode 4 of the light-emitting element layer 2 formed in the upper layer of the array substrate 3 is electrically connected to the TFT of the array substrate 3. Furthermore, the light-emitting device 1 includes a light absorption layer 14, a sealing layer 16, and a protection film 18 on a light-emitting face DS side of the second electrode 12.

In the present embodiment, the first electrode 4 is an anode electrode and the second electrode 12 is a cathode electrode. Further, without being limited thereto, the first electrode 4 may be a cathode electrode and the second electrode 12 may be an anode electrode.

In the present embodiment, the light-emitting element layer 2 includes a first light-emitting element 2R, a second light-emitting element 2G, a third light-emitting element 2B. The first light-emitting element 2R, the second light-emitting element 2G, and the third light-emitting element 2B may be organic EL elements, that is OLED elements, in which the light-emitting layer 8 includes an organic fluorescent material or an organic phosphorescent material. Furthermore, in addition to this, the first light-emitting element 2R, the second light-emitting element 2G, and the third light-emitting element 2B may be QLED elements in which the light-emitting layer 8 includes a semiconductor nanoparticle material, that is, a quantum dot material. However, in the present embodiment, the QLED elements or various light-emitting elements, without being limited to the OLED elements, can be used for the first light-emitting element 2R, the second light-emitting element 2G, and the third light-emitting element 2B.

Here, each of the first electrode 4, the first charge transport layer 6, and the light-emitting layer 8 is separated by edge covers 20. In particular, in the present embodiment, the first electrode 4 is, by the edge covers 20, separated into a first electrode 4R for the first light-emitting element 2R, a first electrode 4G for the second light-emitting element 2G, and a first electrode 4B for the third light-emitting element 2B. Further, the first charge transport layer 6 is, by the edge covers 20, separated into a first charge transport layer 6R for the first light-emitting element 2R, a first charge transport layer 6G for the second light-emitting element 2G, and a first charge transport layer 6B for the third light-emitting element 2B. Further, the light-emitting layer 8 is, by the edge covers 20, separated into a first light-emitting layer 8R, a second light-emitting layer 8G, and a third light-emitting layer 8B.

The second charge transport layer 10 and the second electrode 12 are not separated by the edge covers 20 and are formed in common. As illustrated in (b) of FIG. 1, the edge covers 20 may be formed so as to cover side surfaces and near peripheral end portions of an upper surface of the first electrode 4.

In the present embodiment, the first light-emitting element 2R includes the first electrode 4R, the first charge transport layer 6R, the first light-emitting layer 8R, the second charge transport layer 10, and the second electrode 12. The second light-emitting element 2G includes the first electrode 4G, the first charge transport layer 6G, the second light-emitting layer 8G, the second charge transport layer 10, and the second electrode 12. Furthermore, the third light-emitting element 2B includes the first electrode 4B, the first charge transport layer 6B, the third light-emitting layer 8B, the second charge transport layer 10, and the second electrode 12.

In the present embodiment, the first light-emitting layer 8R, the second light-emitting layer 8G, and the third light-emitting layer 8B emit red light that is light of a first color, green light that is light of a second color, and blue light that is light of a third color, respectively. In other words, the first light-emitting element 2R, the second light-emitting element 2G, and the third light-emitting element 2B are light-emitting elements that emit the red light, the green light, and the blue light, respectively, which are different colors from each other.

Here, the blue light is, for example, light having a light emission center wavelength in a wavelength band of 400 nm or more and 500 nm or less. Further, the green light is, for example, light having a light emission center wavelength in a wavelength band of greater than 500 nm and 600 nm or less. Further, the red light is, for example, light having a light emission center wavelength in a wavelength band of greater than 600 nm and 780 nm or less.

The first electrode 4 and the second electrode 12 include conductive materials and are electrically connected to the first charge transport layer 6 and the second charge transport layer 10, respectively. Of the first electrode 4 and the second electrode 12, the electrode closer to the light-emitting face DS is a semitransparent electrode. In the present embodiment, the first electrode 4 may be an anode and the second electrode 12 may be a cathode. However, without being limited thereto, the polarities of the first electrode 4 and the second electrode 12 may be reversed.

The first electrode 4 has a configuration in which ITO (Indium Tin Oxide) is layered on, for example, an Ag—Pd—Cu alloy. The first electrode 4 having the above configuration is a reflective electrode that reflects light emitted from the light-emitting layer 8. Therefore, among the light emitted from the light-emitting layer 8, light directed in the downward direction can be reflected by the first electrode 4.

On the other hand, the second electrode 12 is configured by, for example, a semitransparent Mg—Ag alloy. That is, the second electrode 12 is a transmissive electrode that transmits the light emitted from the light-emitting layer 8. Therefore, among the light emitted from the light-emitting layer 8, light directed in the upward direction passes through the second electrode 12. In this manner, the light-emitting device 1 can emit the light emitted from the light-emitting layer 8 in the upward direction.

As described above, in the light-emitting device 1, both the light emitted in the upward direction and the light emitted in the downward direction from the light-emitting layer 8 can be directed toward the second electrode 12 (upward direction). That is, the light-emitting device 1 is configured as a top-emitting type light-emitting device. Since both the light emitted in the upward direction from the light-emitting layer 8 and the light emitted in the downward direction from the light-emitting layer 8 are available as light emission from the light-emitting device 1, the light-emitting device 1 can improve the usage efficiency of the light emitted from the light-emitting layer 8.

In the present embodiment, the second electrode 12, which is a semitransparent electrode, may partially reflect the light emitted from the light-emitting layer 8. In addition, a cavity of the light emitted from the light-emitting layer 8 may be formed between the first electrode 4, which is a reflective electrode, and the second electrode 12 which is a semitransparent electrode. By forming the cavity between the first electrode 4 and the second electrode 12, the color level of the light emitted from the light-emitting layer 8 can be improved.

Note that the configuration of the first electrode 4 and the second electrode 12 described above is an example, and may be another configuration.

The light-emitting layer 8 is a layer that emits light due to the occurrence of recombination of positive holes transported from the first electrode 4 and electrons transported from the second electrode 12.

When the first light-emitting element 2R is an OLED element, the first light-emitting layer 8R may include, for example, Btp2Ir (acac) (bis-(3-(2-(2-pyridyl) benzothienyl) mono-acetylacetonate) iridium (III) as a light emission dopant. Further, the first light-emitting layer 8R may include, for example, a CDBP (4,4'-bis(carbazole-9-yl)-2,2'-dimethylbiphenyl) as a host material.

When the second light-emitting element 2G is an OLED element, the second light-emitting layer 8G may include, for example, Ir (ppy) 3 (tris (2-phenylpyridinato) iridium (III)) as a light emission dopant. Further, the second light-emitting layer 8G may include, for example, CBP (4,4'-di (N-carbazolyl) biphenyl) as a host material.

When the third light-emitting element 2B is an OLED element, the third light-emitting layer 8B may include, for example, DPVBi (4,4'-bis (2,2-diphenylvinyl) biphenyl) as a light emission dopant. Further, the third light-emitting layer 8B may include, for example, adamantane anthracene as a host material.

Furthermore, in a case where the first light-emitting element 2R, the second light-emitting element 2G, and the third light-emitting element 2B are QLED elements, the first light-emitting element 2R, the second light-emitting element 2G, and the third light-emitting element 2B may include, in the light-emitting layer 8, the quantum dot material similar to that used in known QLED elements. In other words, the first light-emitting layer 8R, the second light-emitting layer 8G, and the third light-emitting layer 8B may include a known quantum dot material used in light-emitting layers of red, green, and blue QLED elements, respectively.

The first charge transport layer 6 is a layer that transports charges from the first electrode 4 to the light-emitting layer 8. The first charge transport layer 6 may have a function of inhibiting the transport of charges from the second electrode 12. In the present embodiment, the first charge transport layer 6 may be a hole transport layer that transports positive holes from the first electrode 4, which is an anode electrode, to the light-emitting layer 8.

The second charge transport layer 10 is a layer that transports the charge from the second electrode 12 to the light-emitting layer 8. The second charge transport layer 10 may have a function of inhibiting the transport of the charges from the first electrode 4. In the present embodiment, the second charge transport layer 10 may be an electron transport layer that transports electrons from the second electrode 12, which is a cathode electrode, to the light-emitting layer 8.

The first charge transport layer 6, the light-emitting layer 8, and the second charge transport layer 10 may be formed by a traditionally known technique, and may be formed by, for example, vapor deposition using a vapor deposition mask.

The light absorption layer 14 is a layer that absorbs light from the light-emitting element layer 2. The light absorption layer 14 includes, in plane view, a first light absorption layer 22R, a second light absorption layer 22G, and a third light absorption layer 22B in common at positions where the light absorption layer 14 is superimposed on the first light-emitting element 2R, the second light-emitting element 2G, and the third light-emitting element 2B. In the present embodiment, the first light absorption layer 22R absorbs the red light, the second light absorption layer 22G absorbs the green light, and the third light absorption layer 22B absorbs the blue light.

Examples of the material that absorbs blue light and transmit green light and red light, include DNTT (dinaphthothienothiophene) and 3A (oligo (2,6-anthrylene) trimer), etc. Examples of the material that absorbs green light, weakly absorb blue light, and transmit red light, include tetracene and ADT (anthradithiophene), etc. Examples of the material that absorbs red light, weakly absorb green light, and transmit blue light, include H2Pc (anhydrous phthalocyanine), CuPc (copper phthalocyanine), and pentacene, etc. Examples of the material that absorbs red light, transmit green light, and absorb part of blue light include TIPS pentacene, etc.

Thus, in the present embodiment, a red light absorption layer 22R may be formed using, for example, H2Pc, CuPc, pentacene, or TIPS pentacene. Furthermore, the green light absorption layer 22G may be formed using, for example, tetracene or ADT. In addition, the blue light absorption layer 22B may be formed using, for example, DNTT or 3A.

Each layer of a plurality of the light absorption layers 14 may be formed, for example, by vapor deposition using a vapor deposition mask, or at least one layer may be formed by co-evaporation. Note that a film thickness d14 of the light absorption layer 14 is preferably 10 nm or more and 1 μm or less, from the perspective of the balance between film-thinning and a light absorption rate to be described below of the light-emitting device 1.

The light absorption layer 14 also functions as a capping layer for each light-emitting element of the light-emitting element layer 2. In other words, the light-emitting device 1 includes, as the light absorption layer 14, a capping layer that comes into contact with a light-emitting face DS side of the second electrode 12. The capping layer functions of suppressing the generation of plasmon at the interface on the light-emitting face DS side of the second electrode 12. The capping layer improves the extraction efficiency of light emission from the light-emitting element layer 2. The capping layer may be a material whose refractive index is greater than that of atmosphere. Note that the red light absorption layer 22R, the green light absorption layer 22G, and the blue light absorption layer 22B including the materials described above include functions as a capping layer.

The light-emitting device 1 in the present embodiment does not need to include a capping layer in addition to the light absorption layer 14, and it contributes to thinning the light-emitting device 1.

The sealing layer 16 includes a first inorganic sealing film 24, an organic sealing film 26, and a second inorganic sealing film 28, which are layered from a light-emitting element layer 2 side toward a light-emitting face DS side. The first inorganic sealing film 24 and the second inorganic sealing film 28 have a function of preventing moisture or the like from entering each light-emitting element of the light-emitting element layer 2. The organic sealing film 26 has a function of sealing foreign matters in the upper layer of the light-emitting element layer 2, or a function as a buffer layer for the first inorganic sealing film 24 or the second inorganic sealing film 28. The protection film 18 is attached to the surface of the light-emitting device 1 to form the light-emitting face DS.

Figure 2:
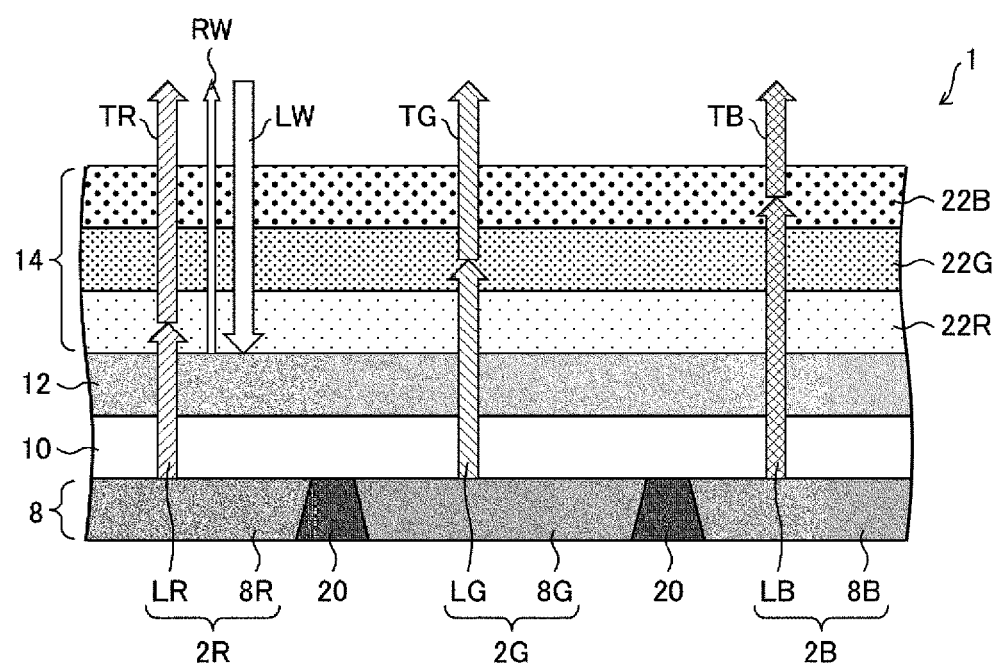
FIG. 2 is an enlarged cross-sectional view illustrating light emission from a light-emitting element of the light-emitting device according to the first embodiment of the present disclosure, and a mechanism for reducing external light reflection in the light-emitting device.

FIG. 2 is an enlarged cross-sectional view illustrating light emission from a light-emitting element layer 2 of the light-emitting device 1 according to the present embodiment, and a mechanism for reducing external light reflection in the light-emitting device 1. FIG. 2 is a cross-sectional view enlarging the light-emitting layer 8 to the light absorption layer 14 illustrated in (b) of FIG. 1.

For example, in the first light-emitting element 2R, it is assumed that red light LR is emitted from the first light-emitting layer 8R toward the light-emitting face DS. In FIG. 2, the red light LR is illustrated as light directly from the first light-emitting layer 8R toward the light-emitting face DS, but in practice the red light LR includes light reflected at the first electrode 4 from the first light-emitting layer 8R toward the first electrode 4. Similarly, in the second light-emitting element 2G, the green light LG is emitted from the second light-emitting layer 8G toward the light-emitting face DS, and in the third light-emitting element 2B, the blue light LB is emitted from the third light-emitting layer 8B toward the light-emitting face DS. Thereafter, red transmitted light TR, green transmitted light TG, and blue transmitted light TB reach the light-emitting face DS and are emitted from the light-emitting device 1.

The red light LR passes through the second electrode 12, which is a semitransparent electrode, and then passes through the first light absorption layer 22R. At this time, the red light LR is partially absorbed by the first light absorption layer 22R to become the red transmitted light TR. Similarly, the green light LG is partially absorbed by the second light absorption layer 22G to become the green transmitted light TG, and the blue light LB is partially absorbed by the third light absorption layer 22B to become the blue transmitted light TB.

Here, it is assumed that external light LW passes through the light emitting surface DS from the outside and is incident on the light-emitting element layer 2. It is assumed that the external light LW is a substantially white light including sunlight, etc. The external light LW is partially reflected by the second electrode 12, which is a semitransparent electrode. Furthermore, the external light LW that has passed through the second electrode 12 is also reflected by the first electrode 4. The light reflected at the first electrode 4 or the second electrode 12 is referred to as reflected light RW illustrated in FIG. 2.

The external light LW passes through the light absorption layer 14 twice, and the light absorption layer 14 includes the first light absorption layer 22R, the second light absorption layer 22G, and the third light absorption layer 22B. Therefore, in the external light LW that is substantially white light, substantially all wavelength components are absorbed. In addition, the proportion of the light absorbed by the light absorption layer 14 is large compared to the red transmitted light TR, the green transmitted light TG, and the blue transmitted light TB, which pass through the light absorption layer 14 once. Accordingly, the intensity of the reflected light RW, which is reflected by the external light LW, can be reduced compared to the red transmitted light TR, the green transmitted light TG, and the blue transmitted light TB emitted from the light-emitting layer 8.

Therefore, the light-emitting device 1 can reduce the reflected light of external light against the light emitted from the light-emitting element layer 2, whereby the reflected light can be difficult to be visibly recognized by the viewer of the light-emitting device 1.

For example, it is assumed that the light absorption rate of the light absorption layer 14 to incident light is 60%, 70%, 80%, or 90%. In this case, the intensity of the reflected light RW with respect to the external light LW can be reduced to 16%, 9%, 4%, or 1%. When the light absorption rate of the incident, light of the light absorption layer 14 is from 60% to 90%, the intensity of the red transmitted light TR, the green transmitted light TG, and the blue transmitted light TB can be ensured while sufficiently reducing the intensity of the reflected light RW.

In the present embodiment, the light-emitting device 1 absorbs the external light by the light absorption layer 14 to reduce the reflected light. Therefore, the light-emitting device 1 does not need to include a circular polarizer having a thick film compared to the light absorption layer 14 and contributes to thinning film and improving flexibility. In addition, in the light-emitting device 1, the light emission from the light-emitting element layer 2 is not greatly absorbed by the light absorption layer 14. In particular, the light absorption layer 14 can reduce absorption of light emitted from the light-emitting element layer 2 compared to the circular polarizer. Therefore, the light extraction efficiency can be improved, which leads to the improved luminous efficiency. Furthermore, the light-emitting device 1 does not include a circular polarizer, so that the color sticking that depends on the viewing angle with respect to the light-emitting face DS is reduced, whereby the viewing angle characteristics of the light-emitting device 1 are improved.

Note that in the present embodiment, the light-emitting device 1 may include the circular polarizer on a light-emitting face DS side of the light absorption layer 14. The circular polarizer may have a structure in which, for example, a λ/4 plate and a linear polarizer are layered. In this case, the light-emitting device 1 includes the circular polarizer, which allows the external light reflection to be further reduced. Furthermore, the light-emitting device 1 reduces the external light reflection even in the light absorption layer 14, and the circular polarizer can be formed thinner than in the related art. As a result, this contributes to thinning the film and improving luminous efficiency, as described above. In particular, in a case where the light-emitting device 1 is a flexible device, the circular polarizer may be thinned to a degree that does not hinder the flexibility, and a film circular polarizer may be used as the circular polarizer.

Furthermore, even in a case where light emitted from a light-emitting layer in each light-emitting element travels in the diagonal direction with respect to the light-emitting device 1, or in a case where the light is emitted from the second electrode 12 of the different light-emitting element after being guided in the planar direction, the light is absorbed by the light absorption layer 14. Therefore, stray light or color mixing can be suppressed between different light-emitting elements, whereby the contrast of the light-emitting device 1 is improved.

In the present embodiment, as illustrated in FIG. 1, the second electrode 12 and the light absorption layer 14 are in contact with each other. In this manner, in the present embodiment, it is preferable that the distance between the second electrode 12 and the light absorption layer 14 is close from the perspective of improving the effects of suppressing stray light or color mixing between different light-emitting elements described above. However, the second electrode 12 and the light absorption layer 14 may be formed at a certain distance. For example, the distance between the second electrode 12 and the light absorption layer 14 may be 1000 nm or less.

Note that the light-emitting device 1 according to the present embodiment is a flexible device. The sealing layer 16 is used for sealing the light-emitting device 1. However, without being limited thereto, the light-emitting device 1 in the present embodiment may be a rigid device, and the sealing of the light-emitting device 1 may be realized by a glass frit sandwiched between two glass substrates.

Second Embodiment

Figure 3:
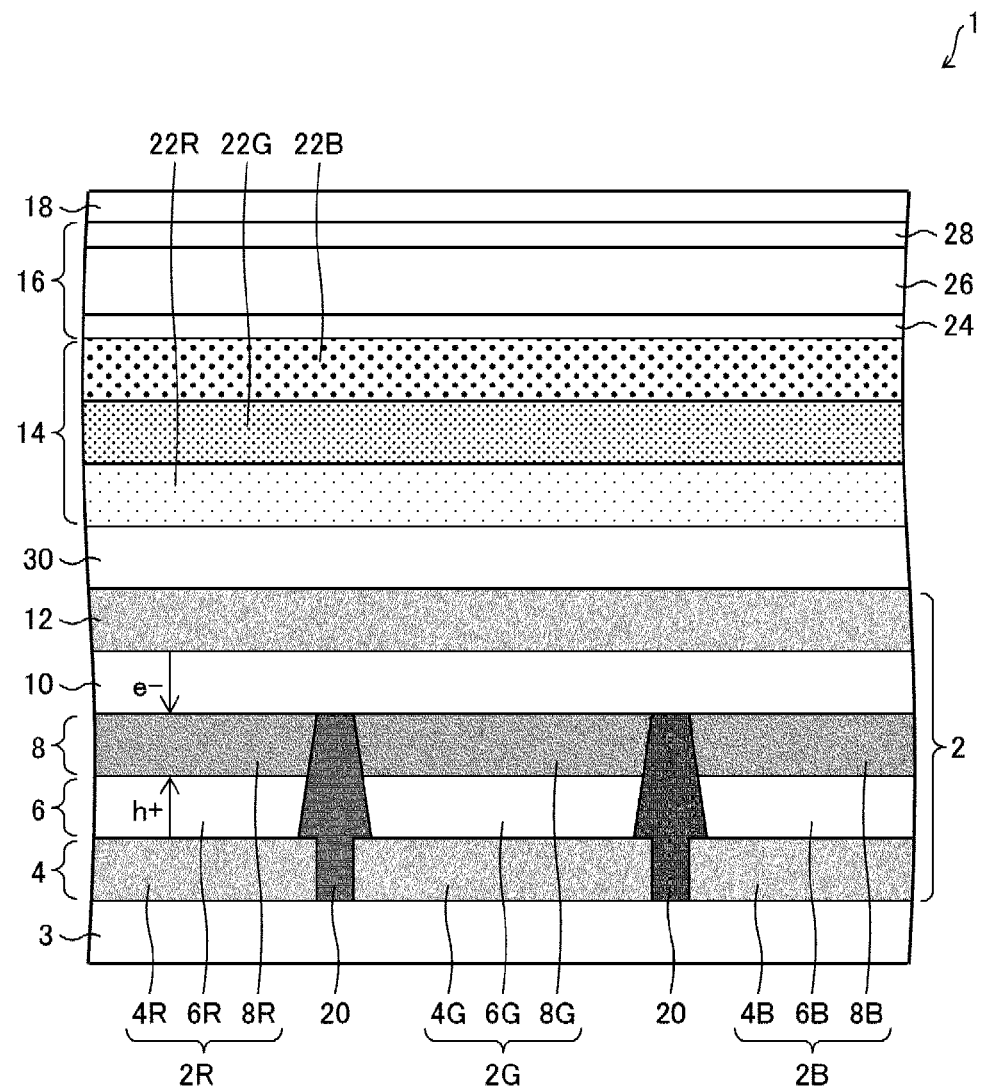
FIG. 3 is a schematic cross-sectional view of a light-emitting device according to a second embodiment of the present disclosure.

FIG. 3 is a cross-sectional view, corresponding to (b) of FIG. 1, of the light-emitting device 1 according to the present embodiment. The light-emitting device 1 according to the present embodiment is different in configuration from the light-emitting device 1 according to the previous embodiment only in that a capping layer 30 is provided between the second electrode 12 and the light absorption layer 14.

In the present embodiment as well, the light-emitting device 1 contributes to thinning the film and improving luminous efficiency, as in the previous embodiment. Further, in the present embodiment, the light-emitting device 1 includes the capping layer 30 independently of the light absorption layer 14. As a result, the light absorption layer 14 does not need to serve as a capping layer, and the types of materials that can be used as the material of the light absorption layer 14 increases, so that the degree of freedom in design is improved. Further, the light-emitting device 1 may independently include the capping layer 30 to further improve the light extraction efficiency from the light-emitting element layer 2.

Third Embodiment

Figure 4:
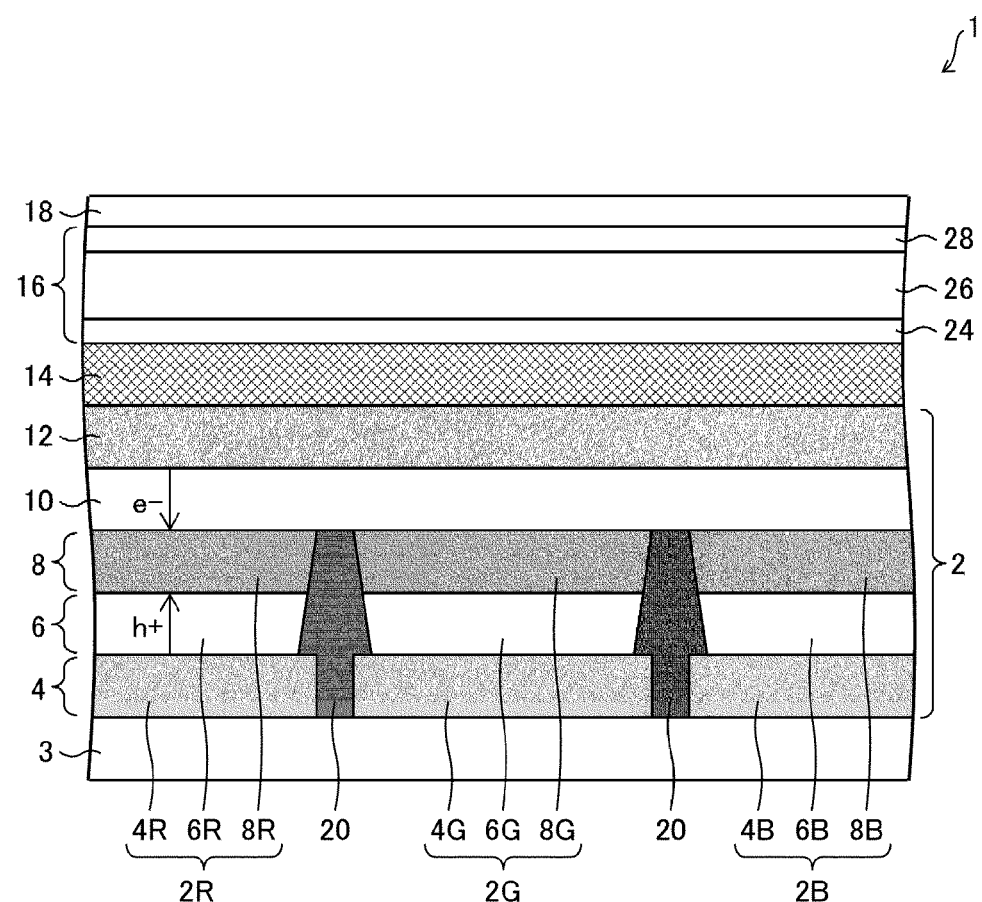
FIG. 4 is a schematic cross-sectional view of a light-emitting device according to a third embodiment of the present disclosure.

FIG. 4 is a cross-sectional view of the light-emitting device 1 according to the present embodiment, corresponding to (b) of FIG. 1. The light-emitting device 1 according to the present embodiment is different in configuration from the light-emitting device 1 according to the first embodiment only in that the light absorption layer 14 is black and a single layer.

In the present embodiment, the light absorption layer 14 may be formed by co-evaporation of, for example, H2Pc, CuPc, pentacene, or TIPS pentacene, tetracene or ADT, and DNTT or 3A.

In the present embodiment, the light absorption layer 14 is colored black. As a result, the light absorption layer 14 partially absorbs light in substantially the entire visible wavelength region. Therefore, in the present embodiment as well, the light-emitting device 1 contributes to thinning the film and improving luminous efficiency, as in the above-described embodiment. In addition, the light-emitting device 1 in the present embodiment includes only the single light absorption layer 14, and it contributes to thinning the light-emitting device 1 and simplifying the manufacturing process.

Fourth Embodiment

Figure 5:
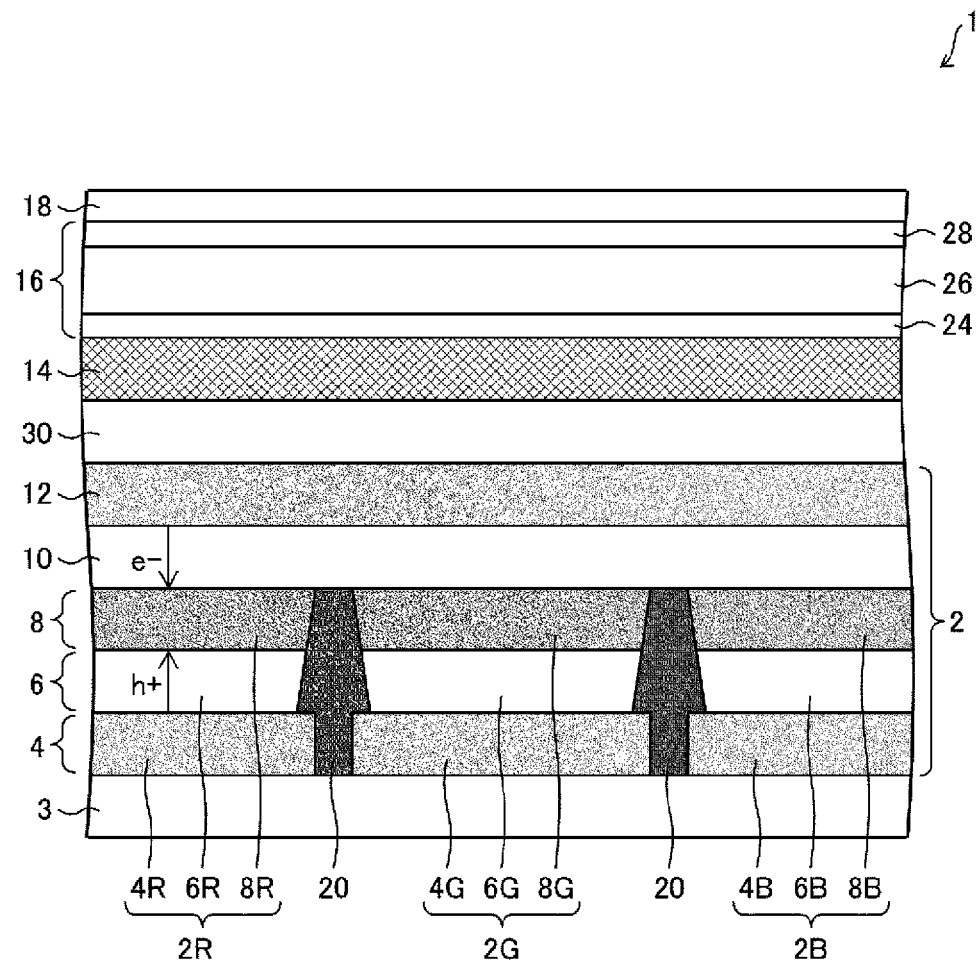
FIG. 5 is a schematic cross-sectional view of a light-emitting device according to a fourth embodiment of the present disclosure.

FIG. 5 is a cross-sectional view of the light-emitting device 1 according to the present embodiment, corresponding to (b) of FIG. 1. The light-emitting device 1 according to the present embodiment is different in configuration from the light-emitting device 1 according to the previous embodiment only in that a capping layer 30 is provided between the second electrode 12 and the light absorption layer 14.

In the present embodiment as well, the light-emitting device 1 contributes to thinning the film and improving luminous efficiency, as in the previous embodiment. Further, in the present embodiment, the light-emitting device 1 includes the capping layer 30 independently of the light absorption layer 14. As a result, the light absorption layer 14 does not need to serve as a capping layer, and the types of materials that can be used as the material of the light absorption layer 14 increases, so that the degree of freedom in design is improved. Further, the light-emitting device 1 may independently include the capping layer 30 to further improve the light extraction efficiency from the light-emitting element layer 2.

Modified Example

Figure 6:
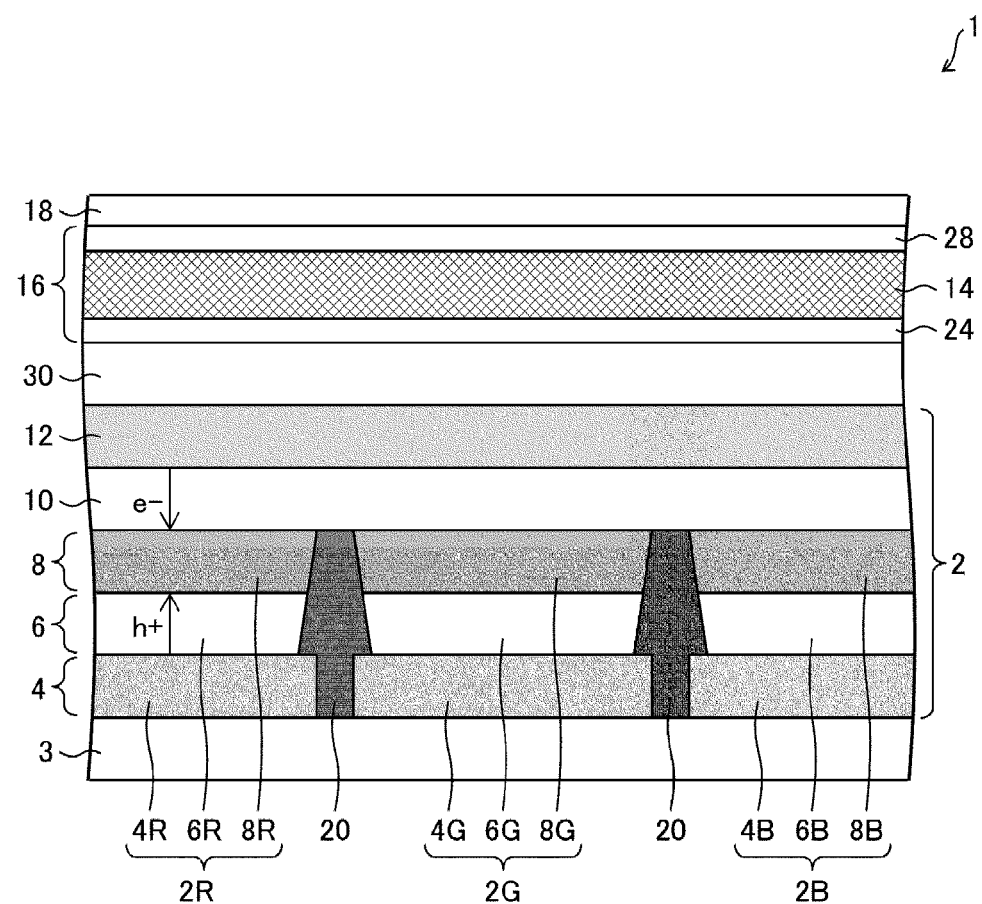
FIG. 6 is a schematic cross-sectional view of a light-emitting device according to a modified example of the present disclosure.

FIG. 6 is a cross-sectional view of the light-emitting device 1 according to the modified example, corresponding to (b) of FIG. 1. The light-emitting device 1 according to the present embodiment is different in configuration from the light-emitting device 1 according to the previous embodiment only in that the light absorption layer 14 that is black and a single layer is included, instead of the organic sealing film 26 of the sealing layer 16. The light absorption layer 14 functions as an organic sealing film of the sealing layer 16.

In the present modified example as well, the light-emitting device 1 contributes to thinning the film and improving luminous efficiency, as in the above-described embodiment. In addition, in the present modified example, the sealing layer 16 includes the light absorption layer 14, so the light absorption layer 14 does not need to be provided independently. Therefore, the light-emitting device 1 in the present modified example further contributes to thinning the film.

Fifth Embodiment

Figure 7:
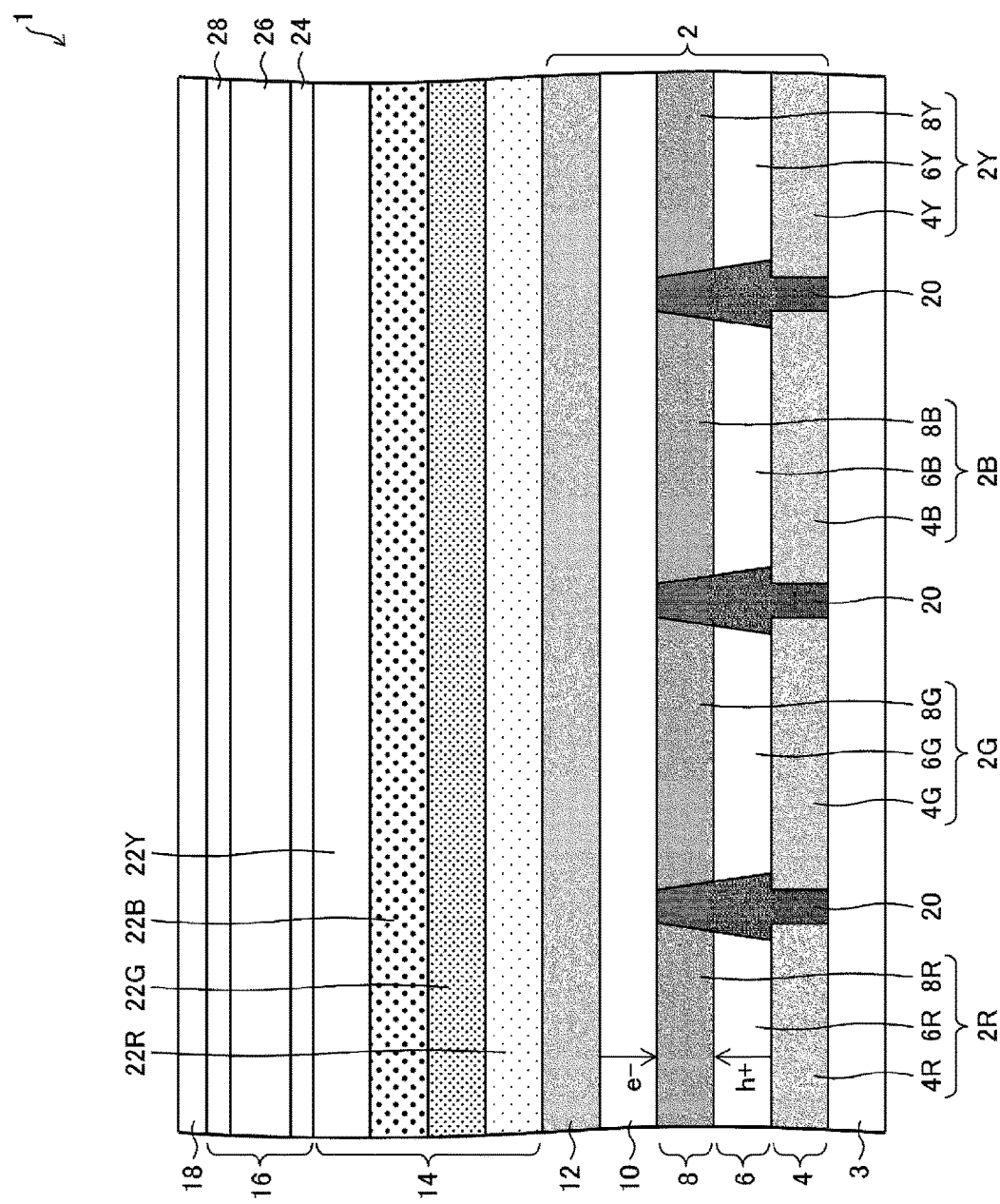
FIG. 7 is a schematic cross-sectional view of a light-emitting device according to a fifth embodiment of the present disclosure.

FIG. 7 is a cross-sectional view, corresponding to (b) of FIG. 1, of the light-emitting device 1 according to the present embodiment. The light-emitting device 1 according to the present embodiment is different in configuration from the light-emitting device 1 according to the first embodiment only in that the light-emitting element layer 2 further includes a fourth light-emitting element 2Y. The first electrode 4 and the first charge transport layer 6 each include a first electrode 4Y and a first charge transport layer 6Y. The fourth light-emitting element 2Y includes a first electrode 4Y, a first charge transport layer 6Y, a fourth light-emitting layer 8Y, the second charge transport layer 10, and the second electrode 12. Further, in the present embodiment, the light absorption layer 14 further includes a fourth light absorption layer 22Y.

Except for the configuration described above, the light-emitting device 1 according to the present embodiment may include a configuration similar to that of the light-emitting device 1 according to the first embodiment.

In the present embodiment, the fourth light-emitting layer 8Y emits yellow light. In other words, the fourth light-emitting element 2Y is a light-emitting element that emits yellow light. Here, the yellow light is, for example, light having a light emission center wavelength in a wavelength band of 560 nm or more and 600 nm or less.

The fourth light-emitting layer 8Y may include, for example, Ir (BT) 2 (acac) (Bis (2-benzo [b] thiophen-2-ylpyridine) (acetylacetoncate) iridium (III)) as a light emission dopant. The fourth light-emitting layer 8Y may include, for example, CBP as a host material.

The yellow light absorption layer 22Y has a function of absorbing yellow light, that is, light having a light emission center wavelength in a wavelength band of 560 nm or more and 600 nm or less. The yellow light absorption layer 22Y is preferably formed using SubPC (subphthalocyanine), for example. Thus, in the present embodiment, the light absorption layer 14 further absorbs the yellow light.

In the present embodiment as well, the effect of thinning the light-emitting device is achieved as in each of the above-described embodiments. Further, in the present embodiment, the color reproducibility of the light-emitting device 1 can be improved by further providing the fourth light-emitting element 2Y that emits yellow light.

Supplement

The light-emitting device of aspect 1 includes a light-emitting face and a plurality of light-emitting elements in which a first electrode, a light-emitting layer, and a second electrode are sequentially layered toward a light-emitting face side, wherein the plurality of light-emitting elements include a first light-emitting element configured to emit light of a first color, a second light-emitting element configured to emit light of a second color different from the first color, and a third light-emitting element configured to emit light of a third color different from the first color and the second color, and on a light-emitting face side of the second electrode, a light absorption layer is provided in common at positions where the light absorption layer is superimposed on the plurality of light-emitting elements in plane view, and the light absorption layer is configured to absorb the light of the first color, the light of the second color, and the light of the third color.

In aspect 2, the light of the first color is red light, the light of the second color is green light, and the light of the third color is blue light.

In aspect 3, the light absorption layer includes a first light absorption layer configured to absorb the light of the first color, a second light absorption layer configured to absorb the light of the second color, and a third light absorption layer configured to absorb the light of the third color.

In aspect 4, the light absorption layer includes the first light absorption layer, the second light absorption layer, and the third light, absorption layer in a layered manner.

In aspect 5, the plurality of light-emitting elements further include a fourth light-emitting element configured to emit light of a fourth color different from the first color, the second color, and the third color, and the light absorption layer is configured to further absorb the light of the fourth color.

In aspect 6, the light absorption layer is black and a single layer.

In aspect 7, a film thickness of the light absorption layer is 10 nm or more and 1 µm or less.

In aspect 8, a light absorption rate of the light absorption layer to incident light is from 60% to 90%.

In aspect 9, a capping layer that comes into contact with the light-emitting face side of the second electrode is provided.

In aspect 10, the capping layer is configured to serve as the light absorption layer.

In aspect 11, the second electrode is a cathode electrode.

In aspect 12, the second electrode is provided in common to the plurality of light-emitting elements.

In aspect 13, a sealing layer is provided on the light-emitting face side of the light absorption layer.

In aspect 14, the light absorption layer is provided between the second electrode and the sealing layer.

In aspect 15, the sealing layer includes a first inorganic sealing film, an organic sealing film, and a second inorganic sealing film in a layered manner.

In aspect 16, a sealing layer including an organic sealing film is provided on the light-emitting face side of the second electrode, and the organic sealing film is the light absorption layer.

In aspect 17, a distance between the second electrode and the it absorption layer is 1000 nm or less.

In aspect 18, a circular polarizer is provided on the the light-emitting face side of the light absorption layer.

In aspect 19, a circular polarizer is not provided on the the light-emitting face side of the light absorption layer.

The present disclosure is not limited to the embodiments described above, and various modifications may be made within the scope of the claims. Embodiments obtained by appropriately combining technical approaches disclosed in each of the different embodiments also fall within the technical scope of the present disclosure. Furthermore, novel technical features can be formed by combining the technical approaches disclosed in the embodiments.

The invention claimed is:

1. A light-emitting device, comprising:
    a light-emitting face; and
    a plurality of light-emitting elements in which a first electrode, a light-emitting layer, and a second electrode are sequentially layered toward a light-emitting face side,
    wherein the plurality of light-emitting elements comprises a first light-emitting layer configured to emit light of a first color, a second light-emitting layer configured to emit light of a second color different from the first color, and a third light-emitting layer configured to emit light of a third color different from the first color and the second color,
    on a light-emitting face side of the second electrode, a light absorption layer is provided so as to overlap the plurality of light-emitting elements in a plane view,
    the light absorption layer comprises a first light absorption layer configured to absorb the light of the first color, a second light absorption layer configured to absorb the light of the second color, and a third light absorption layer configured to absorb the light of the third color, and
    the first light absorption layer, the second light absorption layer, and the third light absorption layer are layered in this order from each of the first light-emitting layer, the second light-emitting layer, and the third light-emitting layer toward the light-emitting face side of a corresponding one of the first color, the second color, and the third color.

2. The light-emitting device of claim 1,
    wherein the plurality of light-emitting elements further comprises a fourth light-emitting layer configured to emit light of a fourth color that is different from the first color, the second color, and the third color, and
    the light absorption layer further comprises a fourth light absorption layer configured to absorb the light of the fourth color.

3. The light-emitting device according to claim 1,
    wherein a film thickness of the light absorption layer is 10 nm or more and 1 µm or less.

4. The light-emitting device according to claim 1, further comprising:
    a capping layer that comes into contact with the light-emitting face side of the second electrode.

5. The light-emitting device of claim 4,
    wherein the capping layer is configured to serve as the light absorption layer.

6. The light-emitting device according to claim 1,
    wherein the second electrode is a cathode electrode.

7. The light-emitting device according to claim 1,
    wherein the second electrode is provided in common to the plurality of light-emitting elements.

8. The light-emitting device according to claim 1,
    wherein a sealing layer is provided on a light-emitting face side of the light absorption layer.

9. The light-emitting device according to claim 8,
    wherein the light absorption layer is provided between the second electrode and the sealing layer.

10. The light-emitting device according to claim 8,
    wherein the sealing layer includes a first inorganic sealing film, an organic sealing film, and a second inorganic sealing film in a layered manner.

11. The light-emitting device according to claim 1,
    wherein a sealing layer including an organic sealing film is provided on the light-emitting face side of the second electrode, and the organic sealing film is the light absorption layer.

12. The light-emitting device according to claim 1,
    wherein a distance between the second electrode and the light absorption layer is 1000 nm or less.

13. The light-emitting device according to claim 1,
    wherein a circular polarizer is not provided on a light-emitting face side of the light absorption layer.

14. The light-emitting device according to claim 1,
    wherein the light of the first color is red light, the light of the second color is green light, and the light of the third color is blue light.

* * * * *